United States Patent [19]

Dowsing, III et al.

[11] Patent Number: 5,541,565
[45] Date of Patent: Jul. 30, 1996

[54] HIGH FREQUENCY MICROELECTRONIC CIRCUIT ENCLOSURE

[75] Inventors: John E. Dowsing, III, Redondo Beach; Jeffrey M. Edwards, Hollywood; Duncan M. Smith, Torrance, all of Calif.

[73] Assignee: TRW Inc., Redondo Beach, Calif.

[21] Appl. No.: 445,965

[22] Filed: May 22, 1995

[51] Int. Cl.$^6$ .............................. H01P 5/02; H01L 23/495
[52] U.S. Cl. .......................... 333/34; 257/664; 257/666; 333/246
[58] Field of Search ............................ 333/34, 246, 247; 257/664, 666, 728

[56] References Cited

U.S. PATENT DOCUMENTS

| | | |
|---|---|---|
| 2,762,116 | 9/1956 | Rudner . |
| 3,419,813 | 12/1968 | Kammitsis ............................ 333/34 X |
| 3,421,972 | 1/1969 | Cromwell et al. . |
| 3,585,533 | 6/1971 | Denhard ................................ 333/22 R |
| 4,641,140 | 2/1987 | Heckaman et al. ..................... 342/371 |
| 4,783,697 | 11/1988 | Benenati et al. . |
| 4,791,473 | 12/1988 | Phy . |
| 4,812,895 | 3/1989 | Funck et al. . |
| 4,891,612 | 1/1990 | Gleason et al. ......................... 333/34 X |
| 4,987,474 | 1/1991 | Yasuhara et al. ........................ 257/666 |
| 5,045,820 | 9/1991 | Leicht et al. .............................. 333/26 |
| 5,075,645 | 12/1991 | Eda et al. ................................... 333/34 |
| 5,089,880 | 2/1992 | Meyer et al. . |
| 5,138,436 | 8/1992 | Koepf . |
| 5,173,767 | 12/1992 | Lange et al. ............................. 257/664 |
| 5,216,806 | 6/1993 | Lam ......................................... 29/848 |
| 5,229,727 | 7/1993 | Clark et al. ............................... 333/33 |
| 5,235,208 | 8/1993 | Katoh ....................................... 257/691 |
| 5,325,072 | 6/1994 | Kohjiro et al. ........................... 330/286 |
| 5,331,203 | 7/1994 | Wojnarowski et al. ................. 257/698 |
| 5,355,102 | 10/1994 | Kornrumpf et al. ..................... 333/33 |
| 5,376,909 | 12/1994 | Nelson et al. ........................... 333/247 |
| 5,418,505 | 5/1995 | Agarwal et al. ....................... 333/34 X |

*Primary Examiner*—Paul Gensler

[57] ABSTRACT

An enclosure assembly for a high frequency integrated circuit. The enclosure assembly includes a plurality of lead terminals that are part of a lead frame. The lead terminals are connected to electrical ports of the circuit within the enclosure to connect the circuit to other integrated circuits and/or to a printed circuit board. A portion of the lead terminals outside of the enclosure has a specially shaped flared region that establishes the characteristic impedance of the circuit on the lead lines outside of the enclosure.

20 Claims, 2 Drawing Sheets

HIGH FREQUENCY MICROELECTRONIC CIRCUIT ENCLOSURE

BACKGROUND OF THE INVENTION

1. Field of the Invention

This invention relates generally to an enclosure assembly for one or more high frequency microelectronic circuits and, more particularly, to an enclosure assembly for one or more high frequency microelectronic circuits that includes a specially configured lead frame that is electrically connected to the circuits, and extends from the enclosure where a portion of the lead frame on the outside of the enclosure includes flared regions that are impedance matched to portions of the lead frame within the enclosure and to the input and output ports of the circuits.

2. Discussion of the Related Art

Currently, many applications exist for high frequency microelectronic integrated circuits operating in the GHz range, especially in conjunction with communication systems. As is well understood, high frequency signals are generally used in communication systems because these signals can be effectively transmitted at low power levels. For example, monolithic microwave integrated circuits (MMICs) have been extensively developed for use in applications such as cellular telephones, satellite receivers, personal communication systems, and remote sensing and control devices. Usually, these types of integrated circuits incorporate gallium arsenide (GaAs) devices including field effect transistors (FETs) and/or heterojunction bipolar transistors and associated circuitry that operate within the GHz frequency range.

In order to reduce power losses and protect these types of delicate integrated circuits against environmental conditions, it is generally a requirement that MMICs, as well as other related types of RF circuits, be packaged in some form of enclosure within a particular system. In order to meet the requirements of the industry, such an enclosure should not only protect the integrated circuit within, but also should be low cost and provide low losses at the operating frequencies of the circuit. Because improvements in the ability to produce low cost MMICs has significantly increased, traditional enclosures formed of one or more of metal, ceramic and plastic currently being used for this purpose have generally been unable to meet the price/performance requirements that are acceptable for the commercial microwave electronics market place. Therefore a need exists for a new low cost enclosure for this purpose.

When designing an enclosure for MMICs, it is necessary to consider impedance matching of a lead frame that connects the. MMIC to other integrated circuits in a particular system, such as power circuits and the printed circuit mother board, so as to reduce or eliminate transitional power losses of the signals between the various circuits. Impedance matching is particularly important for low power circuits so that the signals on the leads are not unnecessarily attenuated resulting in a reduced signal-to-noise ratio. For the types of MMICs discussed here, the MMIC, as well as the other integrated circuits and the mother board within the system, will generally have a characteristic impedance of 50 ohms. Because the MMIC is within an enclosure, the lead frame travels through different materials having different dielectric constants. A characteristic impedance exists for a particular lead frame with respect to the geometry of the lead frame, the distance between the lead frame and a ground plane and the dielectric material that exists between the lead frame and the ground plane. For example, the enclosure and the air outside the enclosure have different dielectric constants. Lack of satisfactory impedance matching at the transition regions between the different dielectric regions causes power losses in the signals being transmitted, as well as other types of effects such as reflective phenomenon. Therefore, different strategies are incorporated to match the characteristic impedance between the transition regions.

U.S. Pat. No. 5,376,909 issued to Nelson et al. discloses a package for an integrated circuit of the type described herein. Nelson et al. discuss providing impedance matching of a lead frame connected to the ports of the circuit at the location where the lead frame exits the package. The impedance matching is achieved by maintaining a predetermined relationship between a ground plane and the lead frame. Particularly, the width of lead lines of the lead frame are altered with respect to their spacing from the ground plane and the dielectric material between the lead lines and the ground plane.

The impedance matching of high frequency integrated circuits can be improved over the prior art. Further, the cost of a package encapsulating an MMIC circuit can be further reduced. It is therefore an object of the present invention to provide such improvements over known integrated circuit device packaging.

SUMMARY OF THE INVENTION

In accordance with the teaching of the present invention, an enclosure assembly for a high frequency integrated circuit is disclosed that provides impedance matching of a lead frame connected to the circuit as it exits the enclosure. A portion of lead terminals of the lead frame within the enclosure that connect the electrical ports of the circuit to other integrated circuits and/or a printed circuit board have a conventional rectangular shape and an impedance that is substantially matched to the characteristic impedance of the circuit. A portion of the lead terminals adjacent an outside wall of the enclosure has a specially shaped flared region that establishes the characteristic impedance of the circuit on the lead lines outside of the enclosure relative to a ground plane of a printed circuit board.

Additional objects, advantages and features of the present invention will become apparent from the following description and appended claims, taken in conjunction with the accompanying drawings.

DETAILED DESCRIPTION OF THE PREFERRED EMBODIMENTS

The following discussion of the preferred embodiments directed to an enclosure assembly for a microelectronic circuit is merely exemplary in nature and is in no way intended to limit the invention or its applications or uses.

Figure 1:
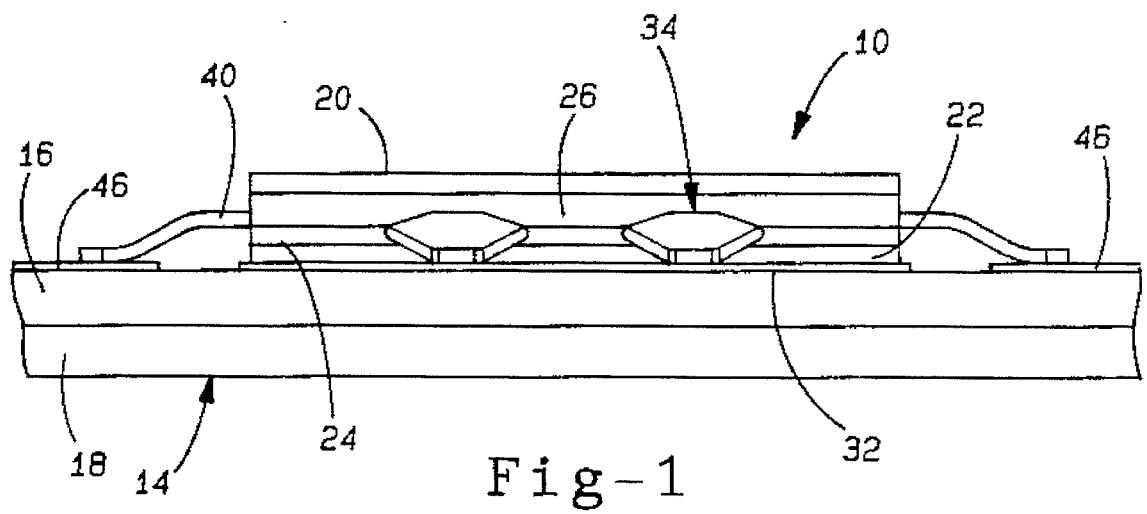
FIG. 1 is a side plan view of a microelectronic circuit enclosure and lead frame extending therefrom connected to a printed circuit board according to an embodiment of the present invention.
Figure 2:
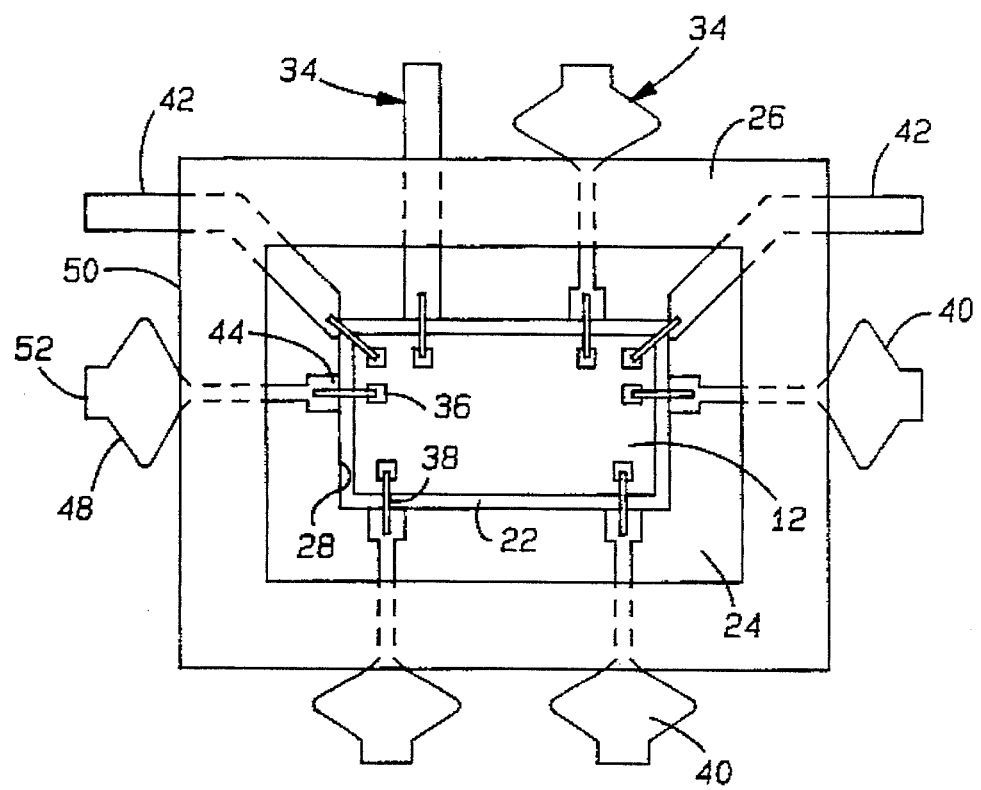
FIG. 2 is a top plan view of the enclosure shown in FIG. 1 in which a cover of the enclosure has been removed and the enclosure has been separated from the printed circuit board.

FIG. 1 shows a side plan view of an enclosure 10 for enclosing and packaging a microelectronic circuit 12 (see FIG. 2). In one embodiment, the microelectronic circuit 12 is an MMIC operating in the GHz frequency range at relatively low power levels. The microelectronic circuit 12 would generally be one circuit component of a larger circuit device (not shown) such as a communication system. The enclosure 10 is mounted on a printed circuit board 14 on which various other integrated circuits (not shown) of the device would also be mounted. It will be appreciated by those skilled in the art, that the enclosure 10 is useful for packaging a plurality of integrated circuits of the type of circuit 12, as well as other types of RF circuits that do not operate at high frequencies. In one embodiment, the printed circuit board 14 includes a protective top layer 16, made of a printed circuit board material such as Teflon, on which the enclosure 10 is mounted, and a metal ground plane 18 below the top layer 16. Printed circuit boards of this type are well known in the art.

The enclosure 10 includes a cover 20. FIG. 2 shows a top plan view of the enclosure 10 with the cover 20 removed to expose the microelectronic circuit 12. In this view, the enclosure 10 has been separated from the printed circuit board 14. The enclosure 10 further includes a metal base layer 22 and a bottom layer 24 formed on the base layer 22. A single piece side wall sealing ring 26 is positioned between the cover 20 and the bottom layer 24 around the microelectronic circuit 12. The cover 20, the bottom layer 24 and the sealing ring 26 are secured together by heat and pressure, and are preferably made of a material that provides a low cost, high quality protective packaging material that has low losses at the microwave operating frequencies of the circuit 12. Teflon is one material that has been shown to have these suitable characteristics. Other materials, including different types of plastics, also have been shown to be adequate for the purposes described herein. Preferable materials for these layers would be known to those skilled in the art. The manner in which the various layers are secured together may vary depending on the particular material.

Figure 3:
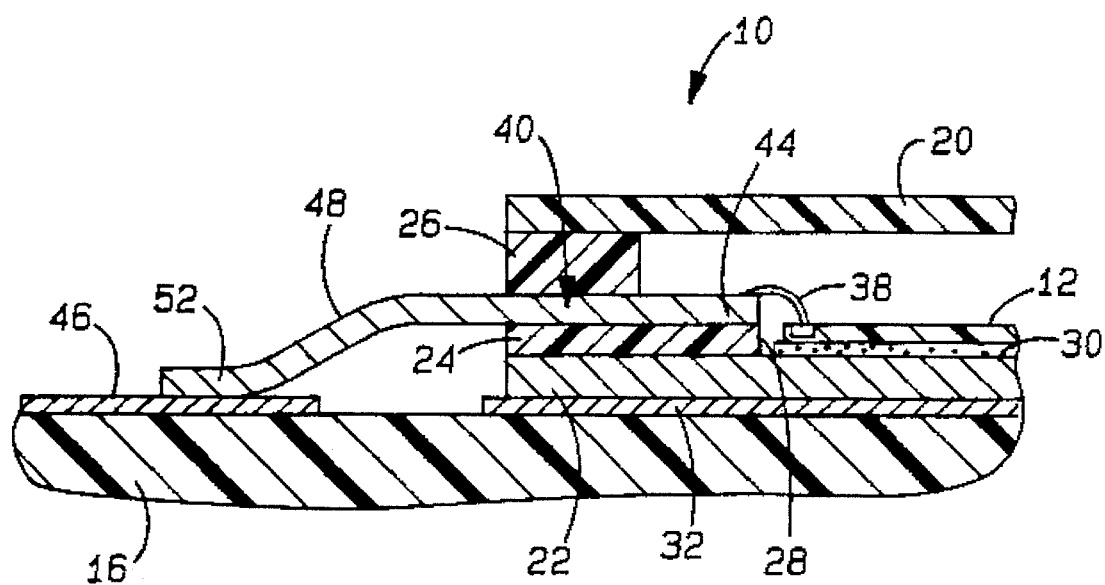
FIG. 3 is a cut-away sectional side view of a portion of the enclosure of FIG. 1 around the area where a lead terminal exits the enclosure.

FIG. 3 shows a cut-away side sectional view of the enclosure 10. An opening 28 is formed by a suitable process, such as etching, through the bottom layer 24 to expose the metal base layer 22 beneath. The microelectronic circuit 12 is mounted to the metal base layer 22 within the opening 28 by an appropriate adhesive layer 30. The base layer 22 acts as a ground plane and a heat sink for the circuit 12. Therefore, the adhesive layer 30 must be made of an appropriate heat conducting material. A ground trace 32 is deposited on the top layer 16 and defined by an etching step to provide a ground connection to the metal base layer 22. A plurality of via holes (not shown) are formed through the top layer 16 by an appropriate fabrication step such as etching so as to make an electrical ground contact between the ground plane 18 and the ground trace 32.

A plurality of microstrip lead terminals 34 that are part of a lead frame are deposited on a top surface of the bottom layer 24 and defined to have a rectangular shape within the enclosure 10 as shown. The lead terminals 34 are microstrips that act in electrical association with the metal base layer 22 within the enclosure 10, and the ground plane 18 outside of the enclosure 10. In one embodiment, the lead terminals are copper strips, but can be any suitable conductive material. The lead terminals 34 extend through appropriately configured openings in the side wall sealing ring 26 to allow the lead terminals 34 to exit the enclosure 10 so as to connect the microelectronic circuit 12 to the various other circuits that are also mounted on the printed circuit board 14.

The lead terminals 34 are electrically connected to terminal pads 36 of the microelectronic circuit 12 by wire bonds 38. The lead terminals 34 are separated into signal terminals 40 that transfer high frequency signals to and from the circuit 12, and power terminals 42 that operate at low frequency and provide power to the circuit 12. A widened portion 44 of the signal terminals 40 adjacent to the opening 28 is provided where the bond wire 38 contacts the signal terminal 40. The signal terminals 40 are electrically connected to signal traces 46 deposited on the top layer 16 outside of the enclosure 10.

Because the signal terminals 40 connect the circuit 12 to other device circuits at high frequency and low power as discussed above, it is generally necessary that the signal terminals 40 be impedance matched to the characteristic impedance of the circuit 12 and to the other circuit components of the device. Generally, the characteristic impedance of circuits of the type of the circuit 12 is about 50 ohms. Of course, other impedances can be matched within the scope of the invention. As is apparent from a review of FIG. 3, as the signal terminals 40 exit the enclosure 10, the metal base layer 22 is no longer below the signal terminals 40. Therefore, the microstrip ground plane for this region is the ground plane 18. Further, because the signal terminals 40 are no longer surrounded by the material of the enclosure 10, the dielectric constant of the material surrounding the signal terminals 40 changes. Therefore, the characteristic impedance on the signal terminals 40 changes accordingly.

In accordance with an embodiment of the present invention, the signal terminals 40 include a flared region 48 adjacent to an outside surface 50 of the sealing ring 26. The flared region 48 extends away from the enclosure 10 and towards the circuit board 14 as depicted in the figures. A rectangular end portion 52 of the signal terminals 40 adjacent to the flared region 48 is electrically connected to the signal trace 46 on the printed circuit board 14. The width of the end portion 52 is greater than the width of the signal terminal 40 within the enclosure.

Figure 4:
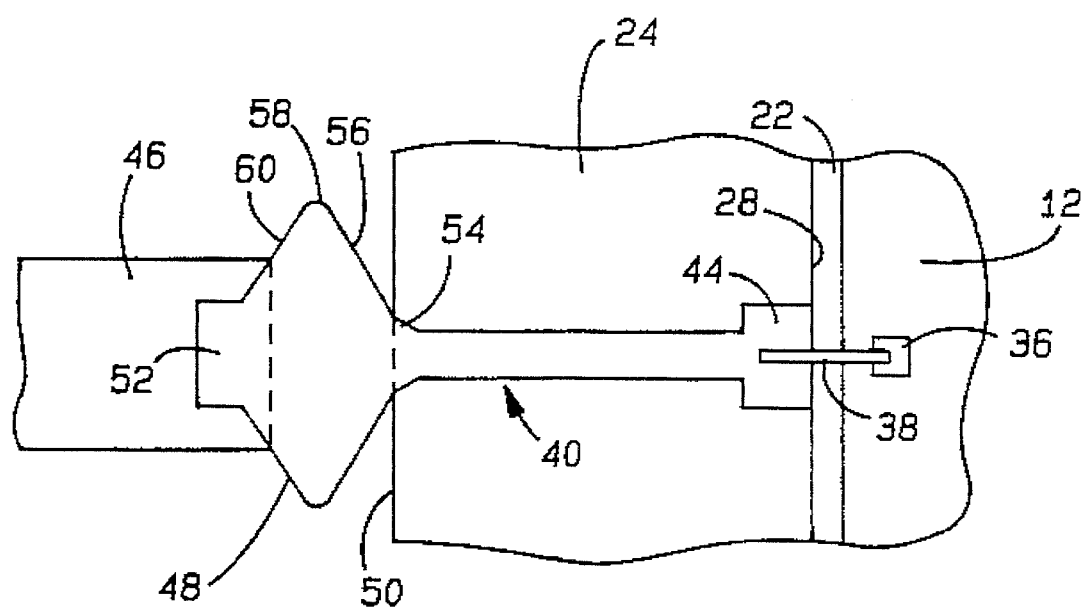
FIG. 4 is a cut-away sectional top view of a portion of the enclosure of FIG. 1 showing a lead terminal exiting the enclosure.

FIG. 4 shows a cut-away sectional top view of the enclosure 10 around the area where the signal terminal 40 exits the enclosure 10 and contacts the signal trace 46. The signal terminal 40 begins to flare at symmetrical curved sections 54 as shown within the sealing ring 26. In one embodiment, the curved sections 54 have a radius of curvature of about 0.01". The curved sections 54 of the flared region 48 continue into outwardly flaring edges 56 that flare out in a symmetrical nature to rounded edge areas 58, as shown. The rounded edge areas 58 continue into inwardly flared edges 60 in a symmetrical nature, and end at the rectangular end portion 52 as shown. Not only does the flared region 48 form this flared configuration when viewed in a plane perpendicular to the plane of the bottom layer 24, the flared region 48 also descends towards the printed circuit board 14 such that the inwardly flared edges 60 contact the signal trace 46 as shown.

The flared region 48 of the signal terminal 40 adjacent to the outside surface 50 of the ring 26 increases the conductive area of the signal terminals 40 as they exit the enclosure 10. Because air has a lower dielectric constant than the dielectric constant of the material of the sealing ring 26, the increased area of the flared region 48 causes the part of the signal terminals 40 outside of the enclosure 10 to be impedance matched to the part of the signal terminals 40 inside of the enclosure 10. The size and angle of flare of the flared region 48 varies depending on the value of the impedance being matched, the thickness of the signal terminal 40, the distance between the signal terminal 40 and the ground plane 18 and the material of the sealing ring 26. Experimentation gives the specific dimensions of the flared region 48 for these parameters. However, the shape of the flared region 48 will generally have the shape as shown, and will not have sharp transition regions.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A microstrip lead line electrically connected to an electronic circuit, said circuit having a characteristic impedance and being positioned within an enclosure, said lead line having a predetermined width within the enclosure, said lead line extending out of the enclosure and including a flared portion that initially flares outward adjacent to an exterior wall of the enclosure where the flared portion has a width greater than the width of the lead line within the enclosure, said flared portion providing that the lead line outside of the enclosure is substantially impedance matched to the lead line within the enclosure.

2. The lead line according to claim 1 wherein the circuit is a microelectronic circuit operating in the microwave frequency range having a characteristic impedance of about 50 ohms, wherein the flared portion also has a characteristic impedance of about 50 ohms.

3. The lead line according to claim 1 wherein the flared portion includes outwardly extending flared edges that extend outward in a symmetrical manner adjacent to the exterior wall of the enclosure, inwardly extending flared edges that extend inward in a symmetrical manner that narrows the width of the flared portion and rounded edge areas between the outwardly extending flared edges and the inwardly extending flared edges.

4. The lead line according to claim 1 wherein the flared portion extends from a rectangular shaped portion of the lead line within the enclosure and returns to a rectangularly shaped portion of the lead line outside of the enclosure, wherein the rectangularly shaped portion of the lead line outside of the enclosure is wider than the rectangularly shaped portion of the lead line within the enclosure.

5. The lead line according to claim 1 wherein the lead line includes curved sections within the exterior wall of the enclosure that flare into the flared portion.

6. The lead line according to claim 1 wherein the flared portion is electrically connected to a signal line outside of the enclosure.

7. The lead line according to claim 6 wherein the signal line is a microstrip signal line on a printed circuit board.

8. An enclosure assembly comprising:

an enclosure, said enclosure including a metal base layer, a bottom layer, a side wall portion and a cover, said bottom layer including an opening that exposes the base layer;

at least one microelectronic circuit, said microelectronic circuit being positioned within the opening on the base layer, said microelectronic circuit including at least one electrical port; and at least one microstrip lead line, said at least one microstrip lead line being electrically connected to the at least one electrical port and extending through the enclosure, said lead line including a flared region outside of the enclosure adjacent to an outside surface of the side wall portion, said flared region initially flaring outward from the outside surface of the side wall portion, said flared region providing that the lead line outside of the enclosure is substantially impedance matched to a characteristic impedance of the at least one circuit.

9. The enclosure assembly according to claim 8 wherein the at least one microelectronic circuit operates in the microwave frequency range and has a characteristic impedance of about 50 ohms.

10. The enclosure assembly according to claim 8 wherein the bottom layer, the side wall portion and the cover are made of a Teflon material.

11. The enclosure assembly according to claim 8 wherein the bottom layer, the side wall portion and the cover are made of a plastic material.

12. The enclosure assembly according to claim 8 wherein the flared portion includes outwardly extending flared edges that extend outward in a symmetrical manner adjacent to the outside surface of the side wall portion, inwardly extending flared edges that extend inwardly in a symmetrical manner that narrows the width of the flared portion and rounded edge areas between the outwardly extended flared edges and the inwardly extended flared edges.

13. The enclosure assembly according to claim 12 wherein the enclosure is mounted on a printed circuit board, and wherein the inwardly extending flared edges extend downward to contact a signal trace on the printed circuit board.

14. The enclosure assembly according to claim 8 wherein the flared portion extends from a rectangularly shaped portion of the lead within the enclosure and returns to a rectangularly shaped portion of the lead line outside of the enclosure, wherein the rectangular shape portion of the lead line outside of the enclosure is wider than the rectangularly shaped portion of the lead line within the enclosure.

15. The enclosure assembly according to claim 8 wherein the lead line includes curved sections within the side wall portion that flare into the flared portion.

16. The enclosure assembly according to claim 8 wherein the enclosure is mounted on a printed circuit board and the at least one lead line is electrically connected to a signal trace on the printed circuit board.

17. A lead line electrically connected to an electronic circuit, said electronic circuit having a characteristic impedance and being positioned within an enclosure, said lead line comprising:

an inside portion being positioned within the enclosure and being electrically connected to the circuit, said inside portion having a rectangular shape; and an outside portion being positioned outside the enclosure and being electrically connected to the inside portion, said outside portion including a flared portion, said flared portion including outwardly extending flared edges that extend outward in a symmetrical manner adjacent to the enclosure, inwardly extending flared edges that extend inward in a symmetrical manner that narrows the width of the flared portion and rounded edge areas between the outwardly extending flared edges and the inwardly extending flared edges, wherein the flared portion causes the outside portion to be impedance matched to the inside portion.

18. The lead line according to claim 17 wherein the outside portion includes a rectangular shaped portion adjacent to the flared portion, wherein a width of the rectangular portion of the outside portion is greater than a width of the inside portion.

19. The lead line according to claim 17 wherein the inside portion includes a curved section within an exterior wall of the enclosure, wherein the curved section curves into the outwardly extending flared edges of the flared portion.

20. The lead line according to claim 17 wherein the flared portion is electrically connected to a signal line outside of the enclosure.

* * * * *